March 29, 1960 WOO F. CHOW ET AL 2,930,996

ACTIVE ELEMENT IMPEDANCE NETWORK

Filed Dec. 14, 1956 2 Sheets-Sheet 1

INVENTORS:
WOO F. CHOW,
JEROME J. SURAN,

BY Robert J. Steinmeyer
THEIR ATTORNEY.

INVENTORS:
WOO F. CHOW,
JEROME J. SURAN,
BY Robert J. Steinmeyer
THEIR ATTORNEY

United States Patent Office 2,930,996

Patented Mar. 29, 1960

2,930,996

ACTIVE ELEMENT IMPEDANCE NETWORK

Woo F. Chow and Jerome J. Suran, Syracuse, N.Y., assignors to General Electric Company, a corporation of New York Application December 14, 1956, Serial No. 628,309

7 Claims. (Cl. 333—80)

This invention relates generally to semiconductor circuits for multiplication of both inductance and the ratio of inductive reactance to resistance, or Q. More particularly, the invention relates to semiconductor circuits employing inductance and Q multiplication in active element filter networks.

In filter circuit applications, such as high-pass or band-pass applications, it is often desirable to obtain a sharp attenuation or rejection of the undesired frequency band. In order to achieve this an inductance, or inductances, are often necessary. And, when the frequency band is low, say in the audio frequency range, the inductances required to produce a proper filter action are often very large and have a relatively low Q. Consequently, it becomes uneconomical, in addition to presenting weight and space problems, to use inductances in filters at low frequencies.

It is therefore an object of our invention to provide circuits which reduce the cost and weight and space requirements of filter circuits.

Another object of our invention is to employ an active element in a circuit in order to multiply the inductance of an inductor.

Still another object of our invention is to improve both the inductance and the Q of a circuit employing an inductor.

A further object of our invention is to provide a filter circuit employing active elements to allow the use of a small inductor to suffice, when taken in conjunction with inductance and Q multiplication characteristics of the active elements.

In carrying out our invention in one form thereof, inductance (L) and Q multiplication is achieved by employing a transistor connected in a two terminal network and including an inductor and a negative impedance or resistance connected in series circuit in the emitter lead. The inductance of the inductor and the Q of the entire circuit are multiplied when measured across the base electrode and the series emitter circuit.

Figures 1, 2:
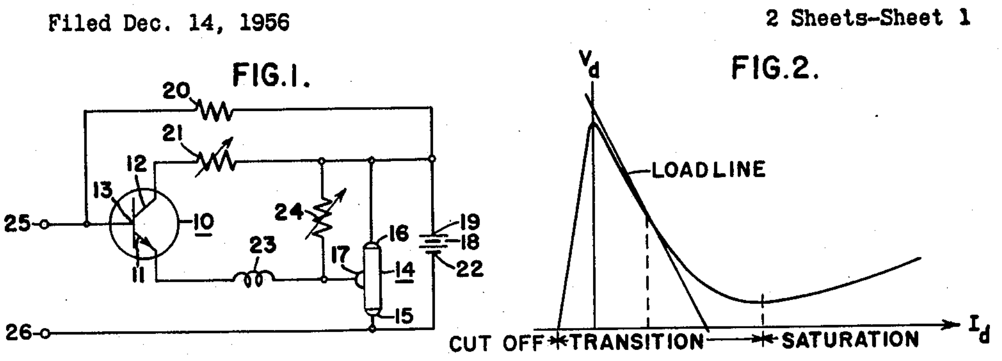
Figure 3:
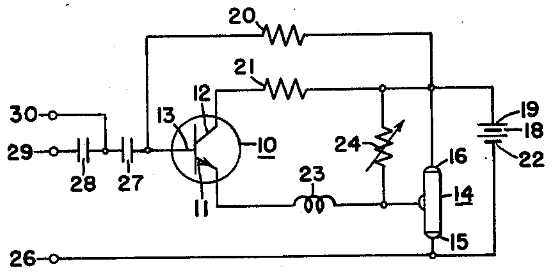
Figure 4:
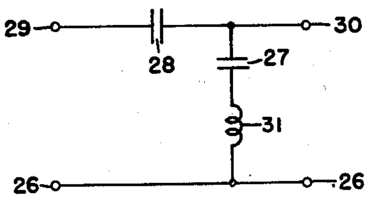
Figure 5:
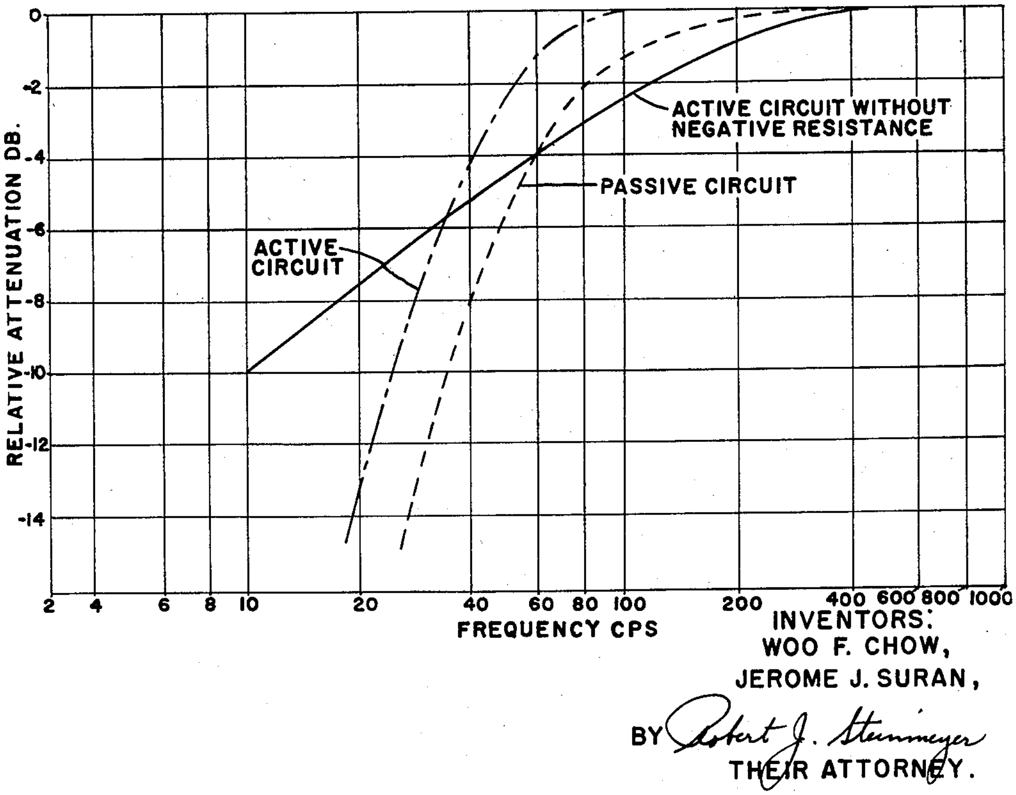
Figure 6:
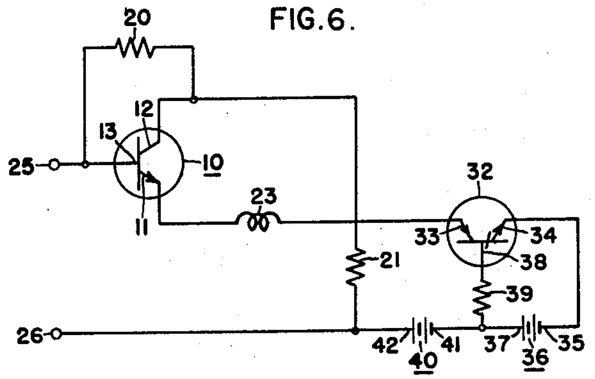
Figure 7:
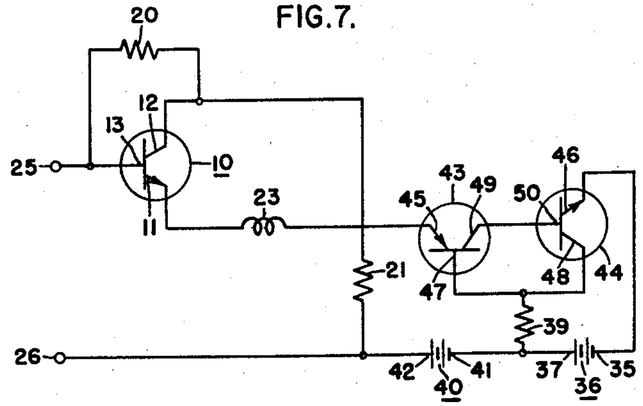
Figure 8:
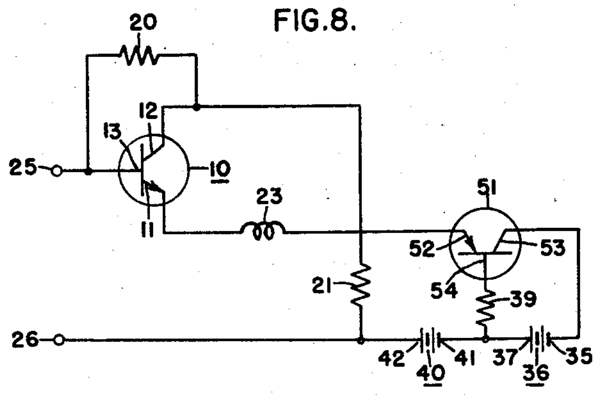

The novel features which we believe to be characteristic of our invention are set forth with particularity in the appended claims. Our invention itself, however, together with further objects and advantages thereof, can best be understood by reference to the following description taken in connection with the accompanying drawings in which Fig. 1 illustrates a circuit diagram of one embodiment of the L and Q multiplier circuit of our invention; Fig. 2 illustrates the input characteristic of the double-base diode employed in the circuit of Fig. 1; Fig. 3 illustrates a section of a high-pass filter circuit employing our invention; Fig. 4 illustrates the equivalent circuit of the high-pass filter section of Fig. 3; Fig. 5 is a graph of attenuation versis frequency for the high-pass filter circuit of Fig. 3 illustrating a comparison between the characteristics of the active circuit, the passive circuit and the active circuit without the negative resistance; Fig. 6 is a modification of the circuit of Fig. 1 using a PNPN transistor; Fig. 7 is another modification using two junction triode transistors; and Fig. 8 is an embodiment employing a point contact transistor.

Referring now to the drawings, in Fig. 1 we have shown a transistor 10 having an emitter electrode 11, a collector electrode 12 and a base electrode 13 and a "double-base diode" 14 (which will be more fully described hereinafter) having a "base-one" electrode 15, a "base-two" electrode 16 and a junction electrode 17. The transistor 10 is biased by connecting a source of unidirectional potential 18 as follows: the positive terminal 19 of source 18 is connected through a base biasing resistor 20 to base electrode 13 and also through a variable collector load resistance 21 to collector electrode 12; the negative terminal 22 of source 18 is connected to emitter electrode 11 of transistor 10 through a series circuit comprising an inductor 23 and the input circuit of "double-base diode" 14 across junction electrode 17 and the "base-one" electrode 15, the "base-one" electrode 15 being connected to negative terminal 22. The "double-base diode" 14 is described by Lesk in U.S. Patent No. 2,769,926, said patent being assigned to the assignee of the present invention. Briefly speaking, the double-base diode 14 is a three-terminal, semiconducting device having a single rectifying junction 17 disposed between spaced ohmic electrodes 15 and 16. The physical characteristics of this device and its basic mode of operation are described in the above referenced patent. The ohmic or base electrodes 15 and 16 serve as output and common electrodes while the rectifying junction 17 serves as an input electrode. The ohmic electrodes 15 and 16 are commonly referred to as base-one and base-two, the base-one electrode ordinarily being the common electrode 15. A D.C. bias 18 is connected across the base electrodes 15 and 16 to make the base-two 16 positive with respect to base-one 15 and the junction 17 is biased at a voltage intermediate the voltages of the base electrodes 15 and 16.

The double-base diode 14 exhibits an input characteristic having three dissimilar regions, as is illustrated in Fig. 2. The first region, termed the "cut-off" region, is characterized by a steeply rising voltage or slope attributable to the fact that the input junction 17 is biased to oppose input current flow. As the input voltage increases to a given peak value established by the interbase potential, the junction bias is reversed and a negative resistance or "transition" region results. By biasing the device in a manner such that the load line crosses the operating characteristic in this negative resistance region alone, and by using small enough signals so that the device is not driven out of this region, the double-base diode 14 functions as a negative resistance. The initial downward slope of the negative resistance region is quite steep but the slope decreases to zero at a valley point after which the slope becomes positive. The region beyond the valley point is termed the "saturating" region and is characterized by a low positive resistance. In both the negative resistance region and in the initial portion of the saturating region the double-base diode 14 exhibits active properties having current gain.

In order to provide the proper biasing for double-base diode 14 its base-two electrode 16 is connected to positive terminal 19 of source 18 and a variable biasing resistor 24 is connected across base-two electrode 16 and junction electrode 17. Input circuit connections are made to the circuit of Fig. 1 at terminals 25 and 26 which are connected to base electrode 13 and base-one electrode 15, respectively.

The operation of the circuit of Fig. 1 may best be understood in the light of the following explanation.

The input impedance of a grounded-emitter transistor amplifier, at low frequencies, is given by $$Z_i=r_b+\frac{Z_e\left(1+\frac{r_L}{r_c}\right)}{(1-\alpha)+\frac{r_L}{r_c}} \qquad (1)$$

where $r_b$ is the resistance of the base electrode 13, $r_L$ is the load resistance, $r_c$ is the collector electrode resistance, $\alpha$ is the current amplification factor and $Z_e$ is the equivalent emitter resistance plus whatever impedance is in series with the emitter. If $r_L<<r_c$, Equation 1 becomes $$Z_i=r_b+\frac{Z_e}{1-\alpha} \qquad (2)$$

If $Z_e$ is given by $$Z_e=r_e+r+j\omega L$$

where $r$ and L are the resistance and inductance in series with the emitter electrode, Equation 2 can be written as $$Z_i=\left(r_b+\frac{r_e+r}{1-\alpha}\right)+\frac{jwL}{1-\alpha} \qquad (3)$$

Since $(1-\alpha)<<1$ for good transistors, both impedances $(r_e+r)$ and $j\omega L$ in Equation 3 are multiplied. Hence, inductance multiplication has been effected at the expense of the Q of the coil. In Equation 3, the effective Q associated with the inductance is $$Q_e=\frac{\omega L}{r_b(1-\alpha)+r_e+r}=\frac{Q_0}{1+\frac{r_e+r_b(1-\alpha)}{r}} \qquad (4)$$

where $$Q_0=\frac{\omega L}{r}$$

Now assume that it is possible to add a negative resistance $-R_x$ in series with the inductance in Equation 3. The input impedance of the transistor circuit is then given by $$Z_i=\left(r_b+\frac{r_e+r-R_x}{1-\alpha}\right)+\frac{j\omega L}{1-\alpha} \qquad (5)$$

From Equation 5 it is apparent that the effective Q of the circuit input impedance is given by $$Q_e'=\frac{Q_0}{1-\left[\frac{R_x-r_b(1-\alpha)-r_e}{r}\right]} \qquad (6)$$

If, in Equation 6, $$\left\{1-\left[\frac{R_x-r_b(1-\alpha)-r_e}{r}\right]\right\}<1 \qquad (7)$$

Q multiplication is achieved. Thus, in a grounded-emitter transistor circuit which contains an inductance and a negative resistance in series with the emitter in accordance with the invention, the effective inductance apparent at the input terminal is $$L_e=\frac{L}{1-\alpha} \qquad (8)$$

while the effective Q associated with this inductance is given by Equation 6. If, furthermore, the current amplification factor $\alpha$ of the transistor is greater than zero and if the condition specified by Equation 7 is met, both inductance and Q multiplication are achieved as desired.

The novel circuit of Fig. 1 achieves both inductance and Q multiplication. The negative resistance required to supply $R_x$ in Equations 5 and 6 is provided by the double-base diode 14. The value of the negative resistance may be adjusted by varying resistor 24. The circuit must be designed so that the capacitance across junction electrode 17 and base-one electrode 15 is low enough to prevent oscillation of the double-base diode 14. Looking into the terminals 25 and 26, the value of the inductance 23 is multiplied in the manner given by Equation 8. In order to vary the multiplication factor, the $\alpha$ of the transistor is made variable by the inclusion of a variable collector load resistor 21. Hence, the two resistors 24 and 21 may be used to vary the Q-multiplication factor and the L-multiplication factor, respectively. In order to prevent the signal distortion which would result from a "floating" base, the base of transistor 10 is biased with a small D.-C. current through resistor 20.

The input characteristic, shown in Fig. 2 and referred to hereinbefore, illustrates the manner in which the double-base diode 14 is biased in order to provide the proper negative resistance characteristics. The characteristic shown exhibits a negative resistance region which appears between junction electrode 17 and base-one electrode 15. The negative resistance region of double-base diode 14 characterizes its active state and its operating region which is utilized in this invention. By properly proportioning the potential of source 18 and the magnitude of resistance 24, the operating point of double-base diode 14 may be stabilized in the transition or negative resistance region of its operating characteristic. This condition of operation is represented graphically by the load line in Fig. 2 in which the operation of double-base diode 14 has been stabilized in its negative resistance region near its peak point, which signifies a strong field condition in double-base diode 14. The magnitude of the input signal across junction electrode 17 and base electrode 15, received from the emitter 11 of transistor 10 through the inductor 23, must remain small enough so that the operation of the device remains within the strong field region of its input characteristic.

An application of the circuit of Fig. 1 to a half section filter network suitable for high-pass, m-derived filters is illustrated in Fig. 3. The circuit of Fig. 3 incorporates the circuit of Fig. 1 and, in addition, capacitors 27 and 28 are connected in series from the base electrode 13 of transistor 10 to an input terminal 29. An output terminal 30 is connected to the point between capacitors 27 and 28. Terminal 26 serves as a common terminal. The equivalent circuit of the active high-pass filter section illustrated in Fig. 3 is shown in Fig. 4 and comprises the capacitor 28 in circuit with the capacitor 27 and an equivalent inductor 31. The input and common terminals 29 and 26 are connected across the series combination, and the output and common terminals 30 and 26 are connected across the capacitor 27 and the equivalent inductor 31 in series.

A typical set of values which have been found suitable for the elements of the circuit of Fig. 3 is as follows:

| | | |
|---|---|---|
| Transistor **10** | | 2N78 |
| Unidirectional source **18** | volts | 6 |
| Resistor **20** | | 120K |
| Resistor **21** | | 2K |
| Inductor **23** | mh | 125 |
| Resistor **24** | | 100K |
| Capacitor **27** | μf | 10 |
| Capacitor **28** | μf | 2 |

The double-base diode 14 is a semiconductor member of rod or bar-like form. The bar is of N-type germanium with a resistivity of approximately 20 ohm-centimeters, which is obtained from an admixture of germanium and a donor impurity such as phosphorous, arsenic or antimony. Base-one and base-two electrodes 15 and 16 are affixed to the respective ends of the bar and conduct current to and from the bar without introducing appreciable rectifying properties, that is they are predominantly bilateral in their conductive properties. Sprayed tin electrodes satisfactorily perform the services of affording an ohmic or bilateral contact. The rectifying junction electrode 17 is established on the bar through the usual application of an acceptor type of impurity such as indium. For this purpose any of the well known techniques for diffusing the acceptor impurity into the bar may be used, in conjunction with such mechanical structure as is needed to provide a reliable contact for junction 17.

The above set of values yielded an equivalent circuit as shown in Fig. 4 at a frequency of 25 cycles per second and a $Q_e$ of 6, the components of such equivalent circuit having the following values:

| | | |
|---|---|---|
| Capacitor **28** | μf | 2 |
| Capacitor **27** | μf | 10 |
| Equivalent inductor **31** | h | 4 |

This is an inductance multiplication of 32 and a Q multiplication of 5, that is, $L_e=32L$ and $Q_e=5Q_0$. Thus by the use of active elements in filter circuits in accordance with our invention, small inductances of comparatively low Q may be used in the design of low frequency filters.

The characteristics of high-pass active and passive filter sections are compared in Fig. 5 which is a plot of frequency in cycles per second against the relative attenuation in db for three conditions, one for the passive circuit, one for the active circuit and one for the active circuit without the negative resistance. The combined L-Q multiplier circuit provides a characteristic which is at least comparable in quality to that obtained with an equivalent passive network.

It is apparent, therefore, that our invention provides inductance and Q multiplication in a network employing active elements and makes feasible the use of small inductors in circuits such as high-pass filter networks.

Figs. 6, 7 and 8, wherein like numerals are used to designate like elements described hereinbefore, illustrate modifications of the invention in which the negative resistance is provided by elements other than double-base diodes. In Fig. 6 a PNPN hook connected transistor 32 is shown with its emitter electrode 33 connected to inductor 23. The conjugate emitter 34 is connected to the negative terminal 35 of bias battery 36. Positive terminal 37 of bias battery 36 is connected to the base electrode 38 of transistor 32 through a base biasing resistor 39. A second bias battery 40 has its negative terminal 41 connected to positive terminal 37 of bias source 36 and its positive terminal 42 connected to terminal 26 and to collector electrode 12 of transistor 10 through collector load resistance 21. Bias batteries 36 and 40 may be replaced if desired by a single bias battery and a potential divider. The operation of this circuit is similar to that of Fig. 1 with the transistor 32 providing the negative resistance.

Fig. 7 shows an embodiment in which two junction transistors 43 and 44 provide the desired negative resistance. Emitter 45 of transistor 43 is connected to inductor 23 and emitter 46 of transistor 44 is connected to negative terminal 35 of bias battery 36, as shown. Base 47 of transistor 43 and collector 48 of transistor 44 are connected together and to the common connection between the bias batteries in the manner illustrated. In addition, collector 49 of transistor 43 and base 50 of transistor 44 are interconnected. The mode of operation is similar to that of Fig. 1 and hence will be apparent to those skilled in the art from the foregoing explanation.

Fig. 8 illustrates the use of a point contact transistor 51 as a means of securing the desired negative resistance. The emitter 52 of point contact transistor 51 is connected to inductor 23 and the collector 53 is connected to negative terminal 35 of bias battery 36. Base electrode 54 of transistor 51 is connected through the resistance 39 to positive terminal 37 of bias battery 36. The remainder of the circuit is the same as that of Fig. 6 and the mode of operation will be apparent from the above description of the operation of Fig. 1.

The values of resistances and voltages in Figures 6, 7 and 8 are such as to bias the various semiconductor devices (other than transistor 10) into their negative resistance regions so that they will provide the requisite negative resistance and improve or multiply the Q of the circuit.

While we have shown particular embodiments of our invention, it will be understood, of course, that we do not wish to be limited thereto, since many modifications may be made, and we, therefore, contemplate by the appended claims to cover any such modifications as fall within the true spirit and scope of our invention.

What we claim as new and desire to secure by Letters Patent of the United States is:

1. A semiconductor circuit for coincidentally multiplying inductance and increasing Q comprising a transistor having base, emitter and collector electrodes; means including bias voltage supply means for connecting said transistor in a two terminal network, a first terminal of said two terminal network connected to said base electrode, inductive means and semiconductor negative resistance means, said inductive means connected in series circuit with said emitter electrode and one terminal of said negative resistance means, a second terminal of said negative resistance means being coupled to a second terminal of said two terminal network, whereby the inductance and Q of said inductive means is multiplied across the series combination of said base electrode, said emitter electrode, said inductive means and said negative resistance means.

2. A semiconductor circuit for inductance and Q multiplication comprising a transistor having base, emitter and collector electrodes; means for connecting said transistor in a two terminal network including a source of direct current biasing potential, a first terminal of said two terminal network connected to said base electrode, an emitter circuit for said transistor including an inductor and a semiconductive negative impedance, said inductor connected in series between said emitter electrode and one terminal of said semiconductive negative impedance, a second terminal of said negative impedance being connected to a first polarity terminal of said source of direct current biasing potential and coupled by a low impedance path to a second terminal of said two terminal network; a collector load impedance connected between said collector electrode and a second polarity terminal of said source; and base biasing means for said transistor comprising an impedance connected between the second polarity terminal of said source and base electrode whereby the inductance and Q of said inductor is multiplied across the series circuit of said base electrode, said inductor and said negative impedance.

3. A semiconductor circuit for inductance and Q multiplication comprising a transistor having base, emitter and collector electrodes; a double-base diode having junction, base-one and base-two electrodes; a source of direct current biasing potential; an emitter circuit for said transistor including an inductor, said junction electrode and said base-one electrode being connected in series between said emitter and a first polarity terminal of said source; a collector load impedance connected between said collector electrode and a second polarity terminal of said source; means interconnecting said base-two electrode and the second polarity terminal of said source; a biasing resistor connected across said junction and said base-two electrode, said biasing resistor and said source having magnitudes arranged to bias the region between said junction and base-one electrodes of said double-base diode into its negative resistance region; and base biasing means for said transistor comprising an impedance connected from the second polarity terminal of said source to said base electrode, whereby the inductance and Q of said inductor is multiplied across said base electrode and said base-one electrode.

4. A semiconductor circuit for inductance and Q multiplication comprising a first transistor having base, emitter and collector electrodes; a PNPN hook connected transistor having emitter, base and conjugate emitter electrodes; a first source of direct current biasing potential having a positive and a negative terminal; a base biasing resistor; an emitter circuit for said first transistor comprising a series circuit including an inductor, said hook emitter electrode, said hook base electrode and said base biasing resistor connected between said emitter of said first transistor and the negative terminal of said first source; a second source of direct current biasing potential having a positive and a negative terminal; means connecting said conjugate emitter to the negative terminal of said second source and the positive terminal of said second source to the negative terminal of said first source, said first and second sources biasing said hook connected transistor into its negative resistance region; a collector load impedance connected between the positive terminal of said first source and said collector electrode; and base biasing means for said first transistor comprising an impedance connected from said first transistor base electrode to said collector electrode, whereby the inductance and Q of said inductor is multiplied across the circuit of said first transistor base electrode and the positive terminal of said first source.

5. A semiconductor circuit for inductance and Q multiplication comprising a first transistor having base, emitter and collector electrodes; a point-contact transistor having emitter, base and collector electrodes, a first source of direct current biasing potential having a first polarity and a second polarity terminal; a first base biasing resistor; an emitter circuit for said first transistor comprising a series circuit including an inductor, said point-contact emitter electrode, said point-contact base electrode and said base biasing resistor connected in series between said first transistor emitter electrode and the second polarity terminal of said first source; a second source of direct current biasing potential having a first polarity and a second polarity terminal; means connecting said point-contact collector electrode to the second polarity terminal of said second source and the first polarity terminal of said second source to the second polarity terminal of said first source, said first and second sources biasing said point-contact transistor into its negative resistance region; a collector load impedance connected between the first polarity terminal of said first source and said first transistor collector electrode; and base biasing means for said first transistor comprising an impedance connected from said first transistor base electrode to said first transistor collector electrode whereby the inductance and Q of said inductor is multiplied across the circuit of said first transistor base electrode and the first polarity terminal of said first source.

6. A semiconductor circuit for inductance and Q multiplication comprising a first transistor having base, emitter and collector electrodes; second and third junction transistors each having a base, an emitter and a collector electrode; first means conductively connecting the collector of said second transistor and the base of said third transistor and a second means conductively connecting the base of said second transistor and the collector of said third transistor; an inductor connected between said emitter of said first transistor and said emitter of said second transistor; a first source of direct current biasing potential having a first polarity and a second polarity terminal; a base biasing resistor connected between said second means and the second polarity terminal of said first source; a second source of direct current biasing potential having a first polarity and a second polarity terminal; means connecting said first polarity terminal of said second source to said second polarity terminal of said first source and said emitter of said third transistor to said second polarity terminal of said second source, said first and second sources biasing said second and third transistors whereby they present a negative impedance across the emitter of said second transistor and said base biasing resistor; base biasing means for said first transistor comprising an impedance connected from said first transistor base electrode to said first transistor collector electrode; and a collector load impedance connected between the first polarity terminal of said first source and said first transistor collector electrode, whereby the inductance and Q of said inductor is multiplied across the circuit of said first transistor base electrode and said first polarity terminal of said first source.

7. A semiconductor low-frequency high-pass filter employing inductance and Q multiplication comprising a transistor having base, emitter and collector electrodes; an input electrode for said filter; two capacitors connected in series between said input electrode and said base electrode; an output electrode connected to a point between said capacitors; a double-base diode having junction, base-one and base-two electrodes; a source of direct current biasing potential; a common electrode connected to a first polarity terminal of said source; an emitter circuit for said transistor including an inductor, said junction electrode and said base-one electrode being connected between said emitter and the first polarity terminal of said source; a collector load impedance connected between a second polarity terminal of said source and said collector electrode; means interconnecting said base-two electrode and the second polarity terminal of said source; a biasing resistor connected across said junction and said base-two electrode, said biasing resistor and said source having magnitudes arranged to bias the region between said junction and base-one electrodes of said double-base diode into its negative resistance region; and base biasing means for said transistor comprising an impedance connected from the second polarity terminal of said source to said transistor base electrode, whereby the inductance and Q of said inductor is multiplied across said transistor base electrode and said base-one electrode, and said input and output electrodes, in conjunction with said common electrode, form an active high-pass filter section.

References Cited in the file of this patent

UNITED STATES PATENTS

| | | |
|---|---|---|
| 1,772,506 | Affel | Aug. 12, 1930 |
| 2,341,655 | Roberts | Feb. 15, 1944 |
| 2,585,077 | Barney | Feb. 12, 1952 |
| 2,585,078 | Barney | Feb. 12, 1952 |
| 2,728,053 | Bangert | Dec. 20, 1955 |
| 2,750,452 | Goodrich | June 12, 1956 |